United States Patent [19]

DiBugnara et al.

[11] 4,039,702
[45] Aug. 2, 1977

[54] METHOD FOR SETTLING A GLASS SUSPENSION USING PREFERENTIAL POLAR ADSORBTION

[75] Inventors: Raymond DiBugnara, Huntington Beach; Richard Allison, Los Angeles, both of Calif.

[73] Assignee: TRW Inc., Los Angeles, Calif.

[21] Appl. No.: 540,410

[22] Filed: Jan. 13, 1975

[51] Int. Cl.$^2$ .................................................. B05D 5/12
[52] U.S. Cl. ................................. 427/93; 427/193; 427/240; 427/299; 427/344; 427/376 A; 427/430 R
[58] Field of Search ............... 427/95, 240, 193, 344, 427/430, 376, 299, 93, 376 A

[56] References Cited

U.S. PATENT DOCUMENTS

| | | | |
|---|---|---|---|
| 762,547 | 6/1904 | Milligan | 427/376 |
| 2,356,553 | 8/1944 | Weissenberg | 427/299 |
| 2,576,845 | 11/1951 | McDonald | 427/376 |
| 2,898,232 | 8/1959 | Miller et al. | 427/344 |
| 3,212,921 | 10/1965 | Pliskin et al. | 427/240 |
| 3,526,530 | 9/1970 | Sams et al. | 427/344 |
| 3,546,013 | 12/1970 | Perri et al. | 427/193 |
| 3,748,156 | 7/1973 | Moore | 427/344 |
| 3,748,157 | 7/1973 | Moore | 427/344 |
| 3,752,679 | 8/1973 | Moore | 427/344 |
| 3,752,681 | 8/1973 | Moore | 427/344 |
| 3,752,689 | 8/1973 | Moore | 427/344 |
| 3,754,945 | 8/1973 | Moore | 427/344 |
| 3,754,946 | 8/1973 | Moore | 427/344 |

*Primary Examiner*—Ronald H. Smith
*Assistant Examiner*—Janyce A. Bell
*Attorney, Agent, or Firm*—Spensley, Horn & Lubitz

[57] ABSTRACT

A method for settling suspended glass particles from a slurry containing small amounts of a substance, which substance is preferentially adsorbed to the surface of the suspended glass particles, and which adsorbed substance facilitates centrifugal sedimentation of the glass particles without substantially altering the colloidal nature of the suspension. In particular, a method for forming a glass film on a semiconductive wafer or circuit, especially mesa etched structures, including the step of adding a small amount of hydrogen peroxide to the glass slurry before sedimentation of the glass film.

11 Claims, 11 Drawing Figures

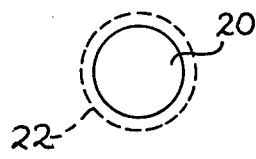
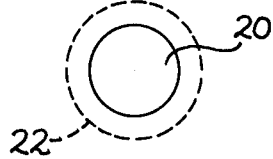
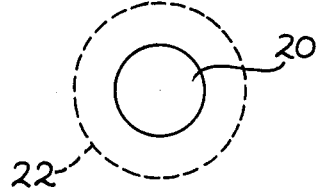
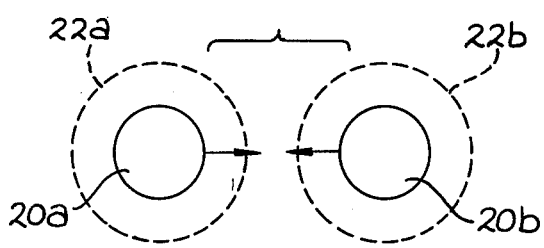
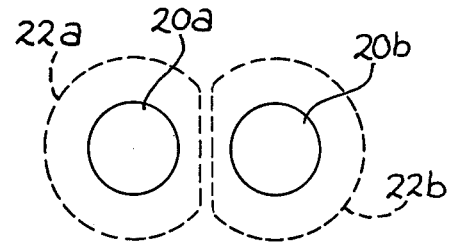
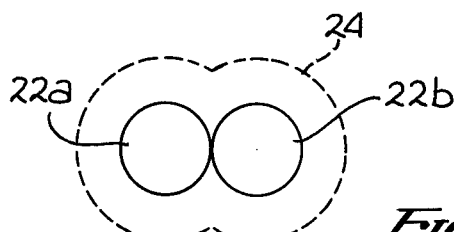

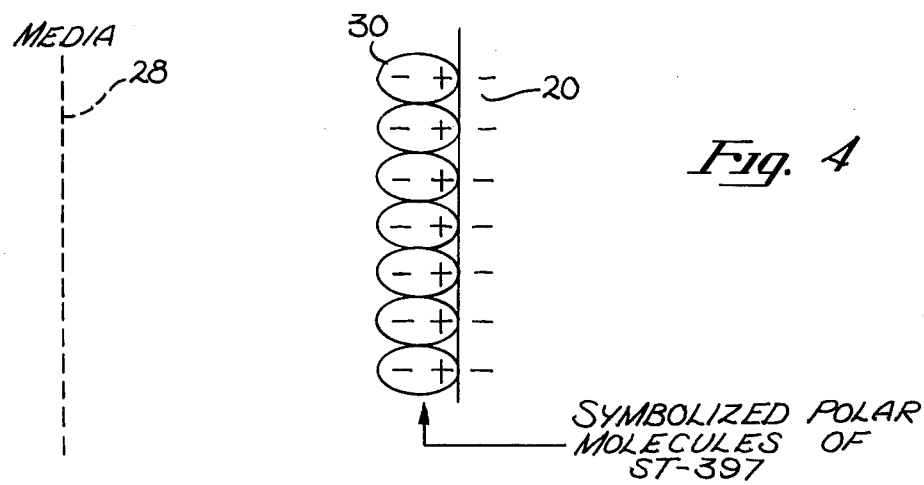
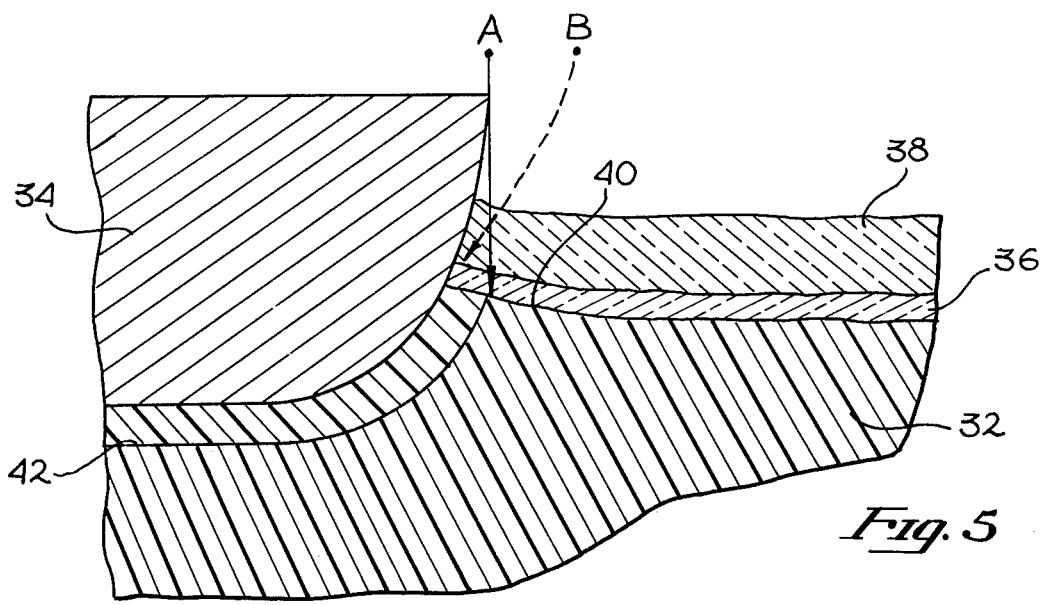
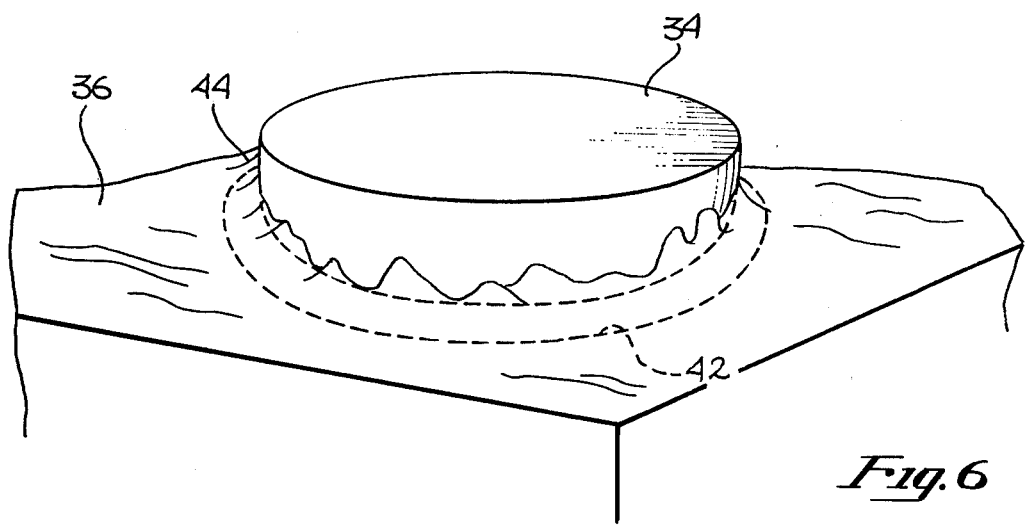

METHOD FOR SETTLING A GLASS SUSPENSION USING PREFERENTIAL POLAR ADSORBTION

BACKGROUND OF THE INVENTION

1. Field of the Invention

The present invention relates to a method of forming a glass film on a semiconductive wafer or circuit utilizing sedimentation of a suspension of glass particles from a dielectric fluid. More particularly, the present invention relates to a method of forming a glass film on a semiconductive or electronic device, such as an integrated circuit or thin or thick film device, including the step of adding a preferentially adsorbed substance and centrifuging the treated dielectric fluid whereby a more cohesive and desirable glass film may be formed at lower centrifugal forces.

2. Description of the Prior Art

The deposition of thin glass films and in particular, electrically passivating coatings on various articles of electronic manufacture, is an important and long practiced art. The prior art forms thin, uniform glass coatings on semiconductive or electronic articles of manufacture by a variety of means, e.g. sputtering, evaporating, or condensation (silox process). In addition the prior art has devised several methods whereby sedimentation from a suspension of glass particles from a fluid is achieved by means of centrifugal force. For example, Pliskin in U.S. Pat. No. 3,212,921 (1965) discloses a method whereby glass particles are suspended in a high dielectric fluid, centrifuged onto the desired substrate, removed from the centrifuged slurry and then heated to fuse the glass layer into an integral coating. This method uses a slurry containing glass particles generally in the range of 0.1–2 microns in diameter; and centrifuge speeds capable of developing from 1000 to 2500 times the force of gravity (1000–2500 g). These high centrifugal forces are in fact so great as to cause the particles to settle from the slurry in substantially straight trajectories. This projectile manner of sedimentation results in a poor covering of mesa or step structures at the surface of the object. In other words, any nontrivial, three dimensional projection from the planar surface of the object casts a shadow or creates an undercut surface which is poorly or substantially not covered by the settling glass particles. In addition to these disadvantages the prior art centrifugal sedimentation method produces a glass film which is only weakly self-cohesive and thus tends to "run out" or to spill from the surface of the coated object upon the slightest disturbance or turbulence of the overlying fluid. The high centrifuging force further causes the glass film to "run out" if the surface of the coated object is inclined with respect to the direction of the centrifugal force.

The prior art has attempted to solve the problems of "run out" during centrifuging or decanting by a method wherein two layers of dielectric fluid are utilized. See Pliskin, in U.S. Pat. No. 3,212,929 (1965). According to this prior art method two miscible dielectric fluids are placed one over the other to form two layers over the object to be coated. The upper layer is a less dense fluid having a higher dielectric constant whereby, as explained below, the colloidal nature of the suspension is improved. The lower layer is a denser fluid having a lower dielectric constant whereby the mutually repelling forces of the particles are lessened and a glass layer is formed which is somewhat more resistant to "run out". Even with the two layer method great care must be taken when adding or decanting the fluids, and it is still necessary to centrifuge the slurry between 1000 to 2500 g, in order to induce sedimentation. In addition, the problem involving coverage of shadow areas caused by steps or mesas on the surface of the object is ignored. It was later found by Pliskin, U.S. Pat. No. 3,505,106 (1970) that the two layer sedimentation process can be replaced in some cases by a process in which a glass suspension, carried in a high dielectric fluid, is diluted by a second dielectric fluid having a low dielectric constant. As a result the dielectric constant of the mixture of the two is approximately intermediate. Thus the particles once suspended in the high dielectric media could be induced to settle more readily from the slurry and be somewhat more resistant to "run out" if the dielectric constant of the slurry could be lowered, which in this case is acheived by dilution by a low dielectric fluid.

A further attempt by the prior art to avoid the problems of "run out" involves the construction of suitable apparatus fitted into the centrifuging cup, whereby the object to be coated slowly rises and lowers into the dielectric fluid in proportion to the amount of applied centrifugal force. The rising and lowering of the object is accomplished by placing the object within the centrifugal cup on a spring loaded platform. Centrifugal force compresses the spring causing the platform to be lowered into the dielectric fluid. Likewise, the spring slowly raises the platform from the fluid as the centrifugal force lessens. See Conrad, in U.S. Pat. No. 3,406,041 (1968). While this apparatus may be a convenient mechanical means for removing the coated object from the fluid in lieu of decanting the fluid, it still does not address the problem of centrifuged "run out" or shadow coverage. Therefore, what is needed then is a method for forming a glass film on an object such that a film may be formed which is resistant to "run out" of the type caused by centrifuging or turbulence during decanting; and which method is capable of forming a flowable glass film thereby eliminating uncovered shadow or undercut areas.

SUMMARY OF THE INVENTION

The present invention is a method for forming a glass layer upon an object of electronic or semiconductive manufacture typically an integrated circuit and in particular an integrated circuit having mesa or step like structures at its surface. In particular, the present invention is an improvement in the methodology of forming glass layers by means of centrifugal sedimentation. The improvement comprises the additional step of adding a preferentially adsorbed substance to the dielectric fluid in which the glass particles are colloidally suspended. The substance serves to alter the electrostatic field around each suspended particle of glass be being adsorbed to the surface thereof. The electrostatic field is altered in such a manner that the particles may be agglomerated at lower centrifugal forces without compromising the colloidal characteristics of the slurry and without diminishing or altering the amount or size of glass particles which will settle from the solution. In other words, the preferentially adsorbed substance is believed to be adsorbed as a single layer of molecules to the surface of the suspended glass particles. The ionic nature of the substance causes the near field electrostatic potential about the particle to be decreased without substantially altering the far field electrostatic potential. Thus, when separated in the colloidal solution, the suspended particles repel one another in the same manner as if the substance was not present. However, when centrifugal force is applied to move the mutually repelling particles into closer proximity to each other, less resistance is encountered when the particles are in each others near field than is the case with untreated particles. Thus the particles more readily agglomerate at lower centrifugal forces. The particles then settle and form a glass layer on the substrate or wafer at the bottom of the centrifugal cup while still being coated by an adsorbed layer of the preferentially adsorbed substance. Therefore, even when deposited in the form of a layer, it is thought that each particle exerts a smaller repelling force on adjacent particles due to the effect of the adsorbed substance upon the near field electrostatic potential around each particle. In this manner a more self-cohesive glass layer is formed than would otherwise be possible. In fact, when lead-aluminum-borosilicate glass is suspended and treated with a preferentially adsorbed substance, according to the present invention the glass layer formed is substantially resistant to "run out" and no special precautions or apparatus need be used when removing the coated object from the centrifuged slurry. The glass layer is then heated to its flow point, thereby driving off the adsorbed substance, and the glass becomes fused into an integral layer.

Because the preferentially adsorbed substance allows the suspended glass particles to agglomerate at lower centrifugal forces or g levels, the glass particles are deposited onto the object in a less projectile manner. The slower velocity of the settling glass particles therefore permits the particles to drift into undercut or shadow areas and irregularities which may form in the glass layer itself, thereby substantially covering the entire surface of the object and forming a smooth glass layer substantially free of holes and dimples. During the last stages of the centrifuging the very finest particles tend to slowly settle, forming a fine silt which flows above the glass layer and up against mesas or projections on the surface with the net result, that the settled glass layer appears to creep up or wash against such projections.

Therefore, it is an object of the present invention to provide a method for forming a glass layer or film upon a semiconductive or electronic article of manufacture such that a self-cohesive glass layer is formed which is resistant to "run out".

It is another object of the present invention to provide a method for settling glass particles from a suspension at lower centrifugal forces such that a layer formed thereby is substantially smooth, free of holes and dimples, and substantially covers the shadow and undercut portions of the surface of the semiconductive or electronic article of manufacture.

It is yet another object of the present invention to provide a method for forming a glass layer upon a semiconductive or electronic article of manufacture by inducing agglomeration at lower centrifugal forces without substantially altering or interferring with the quality of the colloidal suspension.

It is still another object of the present invention to provide a method for settling a glass suspension from a slurry to form a glass layer on an object wherein the glass layer is able to drift or flow while settling, thereby covering or washing against the inclined slopes of mesas or projections extending from the substantially planar surface of the semiconductive or electronic article and thus passivating any underlying region, such as a diffusion junction.

The novel features which are believed to be characteristic of the invention, both as to its organization and the method of operation, together with further objects and advantages thereof will be better understood from the following description considered in connection with the accompanying drawings in which a presently preferred embodiment of the invention is illustrated by way of example. It is to be expressly understood, however, that the drawing is for the purpose of illustration and description only, and it is not intended as a definition of the limits of the invention.

BRIEF DESCRIPTION OF THE DRAWINGS

FIGS. 1a through 1c are simplified schematics showing a colloidal particle and an equipotential line associated with the electrostatic field of the particle.

FIGS. 2a–2c represent a simplified, conceptualization of the agglomeration of two charged colloidal particles and the merging of their respective electrostatic potential envelopes.

FIGS. 3a and 3b are a graphical comparison of the electrostatic field from a colloidal particle measured against distance for particles treated with and without the improvement of the present invention.

FIG. 4 shows a conceptualized view of the manner in which molecules of the preferentially adsorbed substance are adsorbed to the surface of the particles.

FIG. 5 is a simplified cross section of an aluminum contact button embedded in the upper region of a mesa etched semiconductor being coated with a glass layer.

FIG. 6 is a perspective view of an aluminum contact embedded in the upper region of a mesa etched semiconductor substrate showing a deposited glass layer or film according to the method of the present invention wherein the deposited glass has covered an inclined portion of the substrate and washed against an undercut projection extending from the planar surface of the substrate.

DESCRIPTION OF THE PREFERRED EMBODIMENT

The present invention is a method for forming a glass film or layer upon the surface of an integrated circuit wafer or other article of electronic manufacture one embodiment comprising the steps of: forming a colloidal suspension of glass particles in a fluid having a high dielectric constant, which particles have adsorbed thereon a preferentially adsorbed substance; covering the object to be coated by the colloidal solution; settling the colloidal particles onto the surface of the circuit, wafer or article by centrifuging the object to be coated and the colloidal suspension; removing the coated circuit, wafer or article from the dielectric fluid; and heating the coated object to a suitable temperature wherein the glass layer or film fuses to form an integral layer. The present invention and its operation may be better understood by examining FIGS. 1–6 in connection with the following disclosure.

Although the physical chemistry of colloidal suspensions is not perfectly understood it is thought that the suspended particles are kept dispersed in the medium, in part, by mutual electrostatic repulsion. FIGS. 1a through 1c are simplified schematics showing a particle with its surrounding potential field. Although the particles are probably randomly shaped, three dimensional masses, they are conceptually illustrated in FIG. 1 as spheres. Typically, finished colloidal suspensions have particles in the range of 0.1 to 2 microns in diameter although coarser suspensions may have particles as large as 5 to 15 microns in diameter. The size of particles in a stable or semi-stable suspension is largely determined by the charge to mass ratio of the particles. It is further believed that the particles acquire a net negative charge during the grinding process, possibly from broken oxygen bonds on the glass molecules. The particle therefore will exhibit an effective or net charge which will create an corresponding electrostatic potential field about the particle, which for simplicity is represented in FIG. 1 as a spherical equipotential surface 22 centered about a particle 20. In free space the potential field from a charged particle will theoretically extend to infinity, but in practice will not have sufficient strength beyond a certain distance from the charged particles to be significant, which is in FIG. 1 is defined by the spherical envelopes 22. Therefore, for practical purposes any charge outside the area of the spherical envelope 22 is largely unaffected by the electrostatic potential field associated with particle 20. If instead of being immersed in free space or vacuum, the particles were immersed in a dielectric fluid having a high dielectric constant, the reach of influence of the electrostatic field corresponding to the charge on particle 20 would be enhanced. The vector quantity representing the electric field within a dielectric media is a denoted as the displacement vector, D, which is equal to the relative dielectric constant, $k$, times the permittivity constant, $Eo$, times the electric field vector, E. A vacuum has a relative dielectric constant, $k$, equal to unity. A perfectly nonlossy dielectric substance on the other hand has a real relative dielectric constant exceeding unity. Therefore, it can be clearly understood that when particlar 20 is immersed in a high dielectric fluid, the electric displacement vector, D, will have an absolute magnitude exceeding the electric field strength produced by the charge on particle 20 by a proportionality constant equal to the relative dielectric constant of the medium. Therefore, the effective potential envelope 22 corresponding to a given charge distribution will extend further from the center of the charge distribution when immersed in a high dielectric medium (FIG. 1c) than when immersed in vacuum or free space (FIG. 1a). It can be appreciated then that the stability and range of particle sizes in a suspension will depend both upon the mass to charge ratio of the particles, as well as upon the nature of the dielectric medium in which the particles are placed. For example, in a highly dielectric medium particles 20 will repel one another at greater distances of separation and will repel one another with greater forces at the same distances of separation than in a vacuum. Thus, larger particle sizes, less favorable charge to mass ratios or more stable suspensions may be maintained in fluids having a high dielectric constant than in fluids having a low dielectric constant. Although a high dielectric medium will improve the stability and ability to form a colloidal suspension it also makes the agglomeration of the suspended particles more difficult. For example, referring now to FIG. 2a two particles 20a and 20b with their respective potential fields are shown as approaching each other. As the two particles approach, their electrostatic fields 22a and 22b interact and exert a mutually repulsive force (FIG. 2b). If the particles can be driven together with enough force they may coalesce into a single large particle, or they may agglomerate into an aggregate which will be bound together as shown in FIG. 2c within a single electrostatic potential envelope 24. Thus, in a fluid having a high dielectric constant, particles 20a and 20b will tend to repel one another at greater distances and as they approach and repel one another with greater forces than in a medium having a low dielectric constant. In order to agglomerate the particles in a high dielectric medium greater centrifugal forces must be applied to force the particles together. As a result of both this greater centrifugal force and greater mutual repulsion, the undesirable characteristics of "run out" discussed above occur. FIG. 1b illustrates the solution of the prior art wherein particles 20 are effectively removed from a high dielectric environment, (FIG. 1c) to a lower dielectric environment (FIG. 1b) by means of dilution of the medium.

Referring now to FIG. 4, according to the present invention, a preferentially adsorbed substance 30 is added to a fluid 28 having a high dielectric constant at some time either before immersing the object in the fluid or after such immersion, but in any case before centrifuging. Adsorbed substance 30 is characterized by having a dipole moment or charge separation with each molecule of the substance. It is believed that substance 30, by virtue of its dipole moment, is preferentially adsorbed to the surface of particle 20, aligning itself by virtue of its dipole moment and the electrostatic field of the particle as illustrated in FIG. 4. The mechanism by which substance 30 adsorbs to particle 20 is not prefectly understood and it is important to note that not all polar substances adsorb to particle 20 as described herein. It has been observed that the substances which work well within the present invention are water soluble, tend to be ionic when in solution, do not chemically attack the glass and are preferentially adsorbed thereto. FIGS. 3a and 3b illustrate the change in the magnitude of the electric displacement vector D versus the distance from the center of particle 20. In particular FIG. 3a is a graphical representation of the absolute magnitude of the electric displacement vector, D, associated with an untreated particle, corresponding to the methods of the prior art. In contrast, FIG. 3b illustrates the absolute magnitude of the electric displacement vector versus distance from a particle which is treated according to the method of the present invention. At substantial distances from the center of particle 20 the variation of the magnitude of the electric displacement vector is substantially identical in both cases. However, as one approaches the center of the particle the magnitude of the electric displacement vector for the untreated particle increases monotonically and dramatically. However, according to the present invention as one approaches the center of the treated particle the magnitude of the electric displacement vector reaches a maximum and then decreases to a minimum before again rising. Therefore, it is thought that particles treated according to the present invention exert substantially less repulsive force between each other when in close proximity than is the case with untreated particles. However, the longer range forces or far field forces between the treated particles remains largely unchanged, and therefore the colloidal characteristics of the suspension are largely unaffected.

It can be understood then that any substance which is capable of adsorbing to the surface of the glass particles and which is ionic in nature may be suitable for the present invention. Hydrochloric acid, ammonium hydroxide and hydrogen peroxide have been found to be suitable substances. In particular, hydrogen peroxide is especially preferred because of its nontoxity and its compatability with a wide range of glasses. On the other hand, hydrochloric acid and ammonium hydroxide tend to be somewhat more specifically adapted to certain types of glasses, and may form undesirably toxic solutions. In the preferred embodiment an aqueous solution of 30 percent hydrogen peroxide, by weight, is used. A suitable formulation is available from Dupont, Wilmington, Delaware, marketed under the tradename, Albone 30. Albone 30 is a carbon stabilized solution of hydrogen peroxide and is preferred for the reason that it has relatively high purity and does not tend to form corrosive etches, as may be the case in some applications with hydrogen peroxide solutions stabilized by other compounds. Ten milliliters of the 30 percent hydrogen peroxide solution is diluted with 20 milliliters of deionized water to form an approximately 10 percent solution, by weight. Dilution is desirable, especially in large batch processing, in order to buffer the hydrogen peroxide solution and to prevent rapid release of oxygen and heat when the peroxide is subsequently added to the dielectric fluid, which in turn may be highly combustible. However, suggested dilution to a 10 percent solution is not intended to define the present invention which includes undiluted and diluted solutions of every concentration. In the preferred embodiment an alcohol is used as the dielectric fluid, and in particular, methyl alcohol, chosen for its high dielectric constant. However, it is to be expressly understood that any dielectric fluid may be used in the present invention and in particular those having a high dielectric constant. The choice of methyl alcohol as the preferred dielectric fluid is by way of example only and is not intended to define or limit the scope of the present invention. Likewise, in the preferred embodiment a lead-aluminum-borosilicate glass having a flow point at approximately 570° C is used. It has been observed that this type of glass readily forms a suspension and preferentially adsorbs hydrogen peroxide while being extremely tolerant to foreign contaminants without compromising or sacrificing its passivating characteristics. However, the choice of lead-aluminum-borosilicate glasses in the preferred embodiment is not intended to limit or define the scope of the invention but to serve only as one embodiment of the present invention.

A slurry of glass particles is prepared with methyl alcohol by methods well known to the art in which slurry the particle size is generally equal to or less than 2 microns in diameter. The methyl alcohol slurry is then poured over the object or semiconductor wafer to be coated. It is entirely immaterial to the present invention whether the adsorbed substance, hydrogen peroxide, is added before the slurry is poured over the object or afterwards. The diluted (10 percent) hydrogen peroxide solution may be added to a methyl alcohol slurry in proportions ranging from 2 to 40 drops per 25 milliliters of slurry. In other words, any where from 0.32 milliliter to 8 milliliters of diluted hydrogen peroxide solution per 100 milliliters of slurry may be added. No special precautions need be taken to mix the hydrogen peroxide solution with the slurry. It is sufficient to merely titrate the desired amount of hydrogen peroxide solution into the slurry in a dropwise fashion, preferably in a circular or random pattern. The subsequent centrifuging step generally agitates the solution enough to sufficiently disperse the small amount of hydrogen peroxide solution added to the slurry. Typically the diluted hydrogen peroxide solution may be added to the slurry as much as 15 to 30 minutes before the particles are caused to settle by centrifuging without noticeable degradation of the suspension. In the preferred embodiment, the particles in the treated solution are caused to settle on the immersed object by means of centrifugal force, however, any means well known to the art whereby suspended particles may be caused to agglomerate and thereby settle is within the scope of the present invention. In one embodiment of the present invention the circuit, wafer or article and the treated slurry are centrifuged at a low level, for example, approximately 560 g or at least less than 600 g. It has been observed that at this g level a large amount of the treated suspended particles settles out and forms a high quality glass film. The film resists "run out", which may be caused by centrifugal force or decanting, and tends to flow into the shadow or undercut areas. For example, at the higher g levels in methods practiced according to the prior art, as much as 50 milliliters of slurry would be required to deposit approximately 0.75 micron of glass film. However, in the present invention 25 milliliters of slurry centrifuged at approximately 560 g is capable of depositing up to 3.0 microns of glass film. It is therefore an incidental but significant feature of the present invention that a substantial enconomic savings is realized thereby.

FIG. 5 illustrates the mechanism whereby the deposited glass film is thought to flow into the shadow and undercut areas on integrated circuits. FIG. 5 is a cross sectional illustration of a mesa etched semiconductor substrate 32 of P or N type silicon in which an aluminum button 34 has been embedded and below which a junction region 42, of polarity type opposite that of substrate 32, has been formed. In the initial stages of centrifuging, a compact, self-cohesive glass film 36 is deposited upon the surface of substrate 32. In the last stages of the centrifuging, a finer silt of glass particles settles down upon compact layer 36. It is believed that this silt layer 38 is able to flow across the surface of layer 36 thereby filling inclined regions 40 and undercut or shadow areas. For example, according to the prior art the necessary g levels are so great that a particle at point A would settle onto the surface of substrate 32 in a substantially straight trajectory. In addition the high centrifugal forces would cause the particle to slide down incline 40 and thereby to expose junction region 42. However, according to the present invention the g levels are low enough such that it is possible that a particle at point B may settle out of the solution with a largely nonlinear trajectory thereby drifting into shadow or undercut regions. Moreover, it is thought that silt 38 has a tendency under the normal agitation during centrifuging to wash across the surface of substrate 32 against undercut and raised projections, such as aluminum button 34 and regions 40, thereby completely covering junction region 42. A typical example of a finished glass layer of the mesa etched device illustrated in FIG. 5 is shown as a perspective view in FIG. 6. Compact glass layer 36 is continuous across the substantially planar surface of substrate 32 and extends up aluminum button 34. It has further been observed that glass films prepared according to the present invention not only cover sloping region 40 but tend to creep up the sides of aluminum button 34 to form an irregular apron 44. Although one embodiment of the present invention has been illustrated with respect to a mesa etched device, the method is equally applicable with the same beneficial results to planar semiconductor devices, wafers and other articles of electronic manufacture, such as thin or thick film devices.

After centrifuging or otherwise settling the suspended particles onto the coated object, the object is removed from the dielectric fluid and heated to the flow point of the glass. No special precautions need to be taken to prevent "run out" during removal of the coated circuit, wafer or article from the dielectric fluid. Compact layer 36 is extremely self-cohesive and will withstand normal handling without special precautions. In the preferred embodiment, addition of hydrogen peroxide to a suspension of lead-aluminum-borosilicate glass will change the color of the solution from a milkly white to a faint straw yellow. Compact layer 36 remains a faint straw yellow color until the heating step. As the glass film is heated the hydrogen peroxide contained therein is driven off and the glass particles are fused into a integral passivating glass layer. In the preferred embodiment the glass is heated to no more than 570° C and the hydrogen peroxide is driven off, returning the glass to its normal color without creating pin holes, voids or otherwise degrading the quality of the layer.

Further alterations and modifications may be made by those with ordinary skill in the art without departing from the spirit and scope of the present invention.

We claim:

1. A method for forming a glass film on an object comprising:
    covering said object with a dielectric fluid containing a suspension of glass particles, said dielectric fluid being combined with a preferentially adsorbed substance, said particles being covered by an adsorbed layer of said preferentially adsorbed substance;
    disposing said suspended glass particles onto said object;
    removing said article with substantially all of said disposed glass particles thereon from said dielectric fluid; and
    heating said article and said disposed glass to the flow point temperature of said glass of said suspended particles until said glass particles disposed on said object are substantially fused together to form an integral glass film wherein said preferentially adsorbed substance is an aqueous solution selected from the group consisting of hydrogen peroxide, and hydrogen chloride.

2. The method of claim 1 wherein:
    said disposed glass particles are centrifuged within a force less than 600 g.

3. A method for forming a glass film on an object comprising:
    covering said object with a dielectric fluid containing a suspension of glass particles, said dielectric fluid having added thereto a solution of hydrogen peroxide;
    centrifuging said object and said dielectric fluid together to dispose a film of said glass particles onto at least a portion of said object;
    removing said object from said dielectric fluid; and
    heating said glass film to fuse substantially all of said glass particles into an integral layer.

4. The method of claim 3 wherein:
    said solution is an aqueous solution of hydrogen peroxide; and
    said dielectric fluid is an alcohol wherein 0.32 ml to 8 ml of hydrogen peroxide has been combined with 100 ml of said alcohol.

5. The method of claim 3 wherein:
    said solution is hydrogen peroxide and said hydrogen peroxide is added to said dielectric fluid containing a suspension of glass particles after said object is covered by said dielectric fluid.

6. A method for forming a glass layer on an object using a suspension of glass particles in a dielectric fluid, and centrifugal sedimentation therefrom, the improvement comprising:
    adding an aqueous solution of hydrogen peroxide in the proportions of 0.32 ml to 8 ml per 100 ml of dielectric fluid to said dielectric fluid, said hydrogen peroxide being preferentially adsorbed by said glass particles,
    whereby said glass layer formed on said object is compact, substantially uniform and resists running off.

7. The method of claim 6 wherein said use of said suspension of glass particles further comprises:
    covering said object with said dielectric fluid containing said hydrogen peroxide;
    centrifuging said dielectric fluid and object together to form said glass layer on said object;
    removing said object having said glass layer thereon from said dielectric fluid; and
    heating said glass layer to form a substantially integral glass layer on said object.

8. The method of claim 7 wherein:
    said dielectric fluid is an methyl alcohol.

9. A method for forming a glass film on an object comprising:
    covering said object with a dielectric fluid containing a suspension of glass particles, said dielectric fluid being combined with a solution of hydrogen peroxide;
    disposing said suspended glass particles onto said object; and
    removing said object from said dielectric fluid with at least some of said disposed glass particles forming a glass layer on said object.

10. The method of claim 9 wherein said solution is an aqueous solution of hydrogen peroxide, is approximately a 10 percent solution by weight and is combined with said dielectric fluid containing a suspension of glass particles in proportions of 2 to 40 drops of said hydrogen peroxide solution per 25 ml of said dielectric fluid.

11. The method of claim 9 wherein:
    said solution is of hydrogen peroxide and said hydrogen peroxide is a 10 percent aqueous solution by weight and is combined with said dielectric fluid containing a suspension of glass particles in the proportions of 0.32 ml to 8 ml per 100 ml of said dielectric fluid.

* * * * *